United States Patent
Lu et al.

(10) Patent No.: US 8,493,538 B2
(45) Date of Patent: Jul. 23, 2013

(54) FLAT DISPLAY PANEL

(75) Inventors: Chao-Liang Lu, Jhongli (TW);
Chih-Hsiang Yang, Yangmei Township (TW); Kuo-Chih Lee, Sinhua Township (TW)

(73) Assignee: AU Optronics Corp., Hsinchu (TW)

( * ) Notice: Subject to any disclaimer, the term of this patent is extended or adjusted under 35 U.S.C. 154(b) by 763 days.

(21) Appl. No.: 12/394,856

(22) Filed: Feb. 27, 2009

(65) Prior Publication Data

US 2009/0153453 A1  Jun. 18, 2009

Related U.S. Application Data

(62) Division of application No. 10/958,719, filed on Oct. 5, 2004, now Pat. No. 7,515,240.

(51) Int. Cl.
*G02F 1/1345* (2006.01)

(52) U.S. Cl.
USPC ............ 349/151; 349/149; 349/150; 349/152

(58) Field of Classification Search
USPC .................................. 349/149–152
See application file for complete search history.

(56) References Cited

U.S. PATENT DOCUMENTS

| | | | | |
|---|---|---|---|---|
| 5,737,053 | A | * | 4/1998 | Yomogihara et al. ......... 349/149 |
| 6,519,020 | B1 | * | 2/2003 | Cha et al. ...................... 349/150 |
| 7,388,626 | B2 | * | 6/2008 | Wu et al. .......................... 349/54 |
| 2001/0015709 | A1 | * | 8/2001 | Imajo et al. ..................... 345/87 |
| 2003/0038913 | A1 | * | 2/2003 | Choo ............................. 349/149 |
| 2005/0162603 | A1 | * | 7/2005 | Cheng et al. .................. 349/149 |

FOREIGN PATENT DOCUMENTS

| | | |
|---|---|---|
| JP | 04077134 A1 | 7/1992 |
| JP | 11153971 A1 | 6/1999 |
| JP | 2000089241 A1 | 3/2000 |

* cited by examiner

*Primary Examiner* — Huyen Ngo
(74) *Attorney, Agent, or Firm* — WPAT, PC; Justin King

(57) ABSTRACT

A flat display panel comprises a plurality of driver ICs and one or more flexible printed circuit, a plurality of common wires formed on the substrate to electrically connect the ICs to the one or more flexible printed circuit, and at least one anisotropic conductive film that connects respective connecting terminals of the driver ICs and flexible printed circuit to terminals pads of the common wires. The anisotropic conductive film is laminated over the substrate to cover the terminal pads. The driver ICs and flexible printed circuit are aligned and attached on the anisotropic conductive layer by thermocompression bonding.

16 Claims, 4 Drawing Sheets

FLAT DISPLAY PANEL

CROSS-REFERENCE TO RELATED APPLICATION

The present application is a divisional application of copending U.S. application Ser. No. 10/958,719 filed on Oct. 5, 2004, which is incorporated herein by reference.

BACKGROUND OF THE INVENTION

1. Field of the Invention

This invention generally relates to the field of flat display panel manufacture, and more particularly to the interconnection structure and the assembly process of driver components in flat display panels such as liquid crystal display (LCD) panels.

2. Description of the Related Art

The construction of flat display panels such as LCDs generally includes pixel cells arranged in array and driven by means of driver components placed at the peripheral area of the display area. The driver components are conventionally operable to output addressing and data image signals to the pixel cells to control the illumination or extinction for achieving image displaying.

The driver components conventionally include scan driver integrated circuits (ICs) and data driver ICs along two peripheral sides of the display panel. Flexible printed circuits are coupled with the scan and data driver ICs to provide signals such as power, display or ground signals. Many technical approaches are known in the art to assemble the driver components on the LCD panel.

U.S. Pat. No. 6,618,111 issued to Nagata et al., the disclosure of which is incorporated herein by reference, describes a liquid crystal panel in which the driver ICs are embedded on tape carrier packages distributed along the periphery of the display panel. The driver ICs electrically connect via the wiring of the tape carrier packages to wires that couple the driver ICs to a circuit substrate located at a corner of the display panel.

U.S. Pat. No. 6,624,868 issued to Terukina et al., the disclosure of which is also incorporated herein by reference, describes a LCD panel structure in which the driver ICs are mounted on the glass substrate. This reference discloses a structure including wire interconnections that a flexible printed circuit is coupled with a common wiring through a connector at an area between two ICs.

U.S. Patent Application Publication No. US2001/0015709 to Imajo et al., the disclosure of which is incorporated herein by reference, describes a mounting scheme in which the driver ICs are directly mounted on the glass substrate of the LCD panel. Various signals including power signals are supplied to the driver ICs terminals of a flexible printed circuit connected at an outer side of the driver ICs. The flexible printed circuit can also include a protruding portion in an area between two driver ICs. The protruding portion can be provided with a chip capacitor connected with terminals of the flexible printed circuit.

Improvements could be made to the aforementioned assembly schemes of driver components. In particular, the conventional interconnection of the flexible printed circuit with the driver ICs is usually achieved via a complex connector structure or via at least two anisotropic conductive layers respectively attaching the ICs and flexible printed circuit on the substrate. None of these techniques is economically desirable.

Therefore, there is a need in the art for a flat display panel implementation and an assembly process that can reduce the manufacture cost and the processing time in the assembly of driver components in the flat display panel.

SUMMARY OF THE INVENTION

The present invention provides an electrical connection structure and an assembly process that can reduce the material cost and processing time in the assembly of driver components in a flat display panel.

According to one aspect of the present invention, a flat display panel comprises at least two driver ICs and a flexible printed circuit assembled on a substrate, at least one common wire formed on the substrate, and one anisotropic conductive film that connects the two driver ICs and the flexible printed circuit to the common wire.

In one embodiment of the present invention, the flexible printed circuit includes a portion overlapping with a portion of the common wire in an area between the two driver ICs. The portion of the flexible printed circuit is provided with connection terminals located in an area between the two driver ICs.

According to another aspect of the present invention, an assembly process of driver components in a flat display panel is described. An anisotropic conductive film is formed over a peripheral area of the substrate having a common wire. A first and second IC and a flexible printed circuit are placed over the substrate, so that a first connection terminal of the first IC, a second connection terminal of the second IC and a third connection terminal on a portion of the flexible printed circuit are respectively aligned with a first, second and third contact pads provided on the common wire, the third contact pad being located between the first and second contact pads. The ICs and the flexible printed circuit then are pressed against the substrate while the anisotropic conductive film is heated. The ICs and the flexible printed circuit are thereby connected with the common wire through the anisotropic conductive film.

In one embodiment of the present invention, the anisotropic conductive film is laminated as a continuous layer connecting the ICs and flexible printed circuit to the common wire. In a variant embodiment, the ICs include data driver ICs of a LCD panel. In other variations, the ICs include scan driver ICs of the LCD panel.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

The present invention describes an electrical connection structure and an assembly process that can reduce the material cost and processing time in the assembly of driver components in a flat display panel. In exemplary implementations, the following description depicts embodiments in which the flat display panel is a LCD panel. However, the structure and assembly process of the invention are intended to be generally suitable with any types of displays such as electroluminescent displays, plasma displays or the like.

Figure 1A:
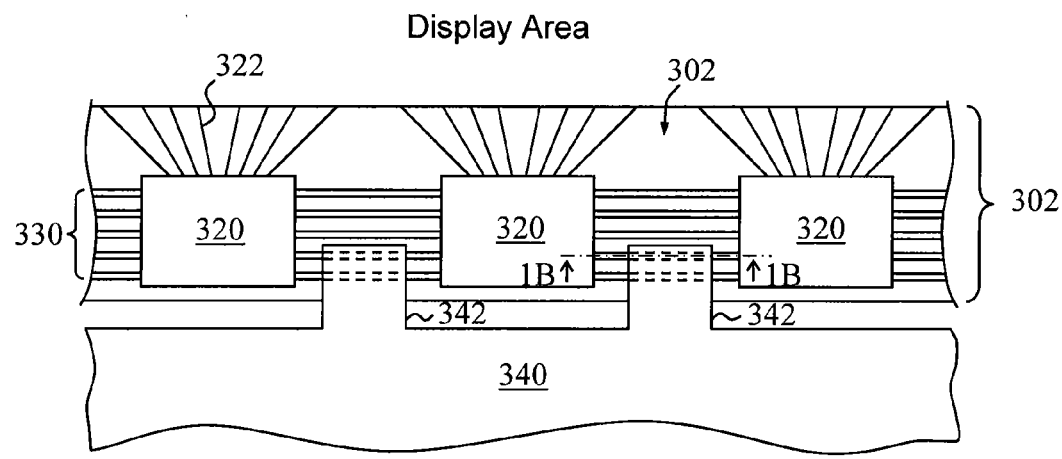
FIG. 1A is a planar view of an connection structure of driver components in a LCD panel according to an embodiment of the invention.

FIG. 1A is a schematic view illustrating the connection scheme of driver components in a LCD panel according to an embodiment of the invention. In a peripheral non-display area 302 of the LCD panel are placed a plurality of driver ICs 320. The driver ICs 320 couple via wiring lines 322 to pixel elements (not shown) located in the display area. The driver ICs 320 can be scan driver ICs or data driver ICs configured to deliver either addressing or image data signals to the pixels for image display.

As illustrated, one or more common wires 330 are provided to connect the driver ICs 320 to a flexible printed circuit 340. The flexible printed circuit 340 includes at least one extending portion 342 positioned in an area of the LCD panel between two neighboring driver ICs 320. The extending portion 342 overlaps with one or more common wiring lines 330 to which the flexible printed circuit 340 is connected.

Figure 1B:
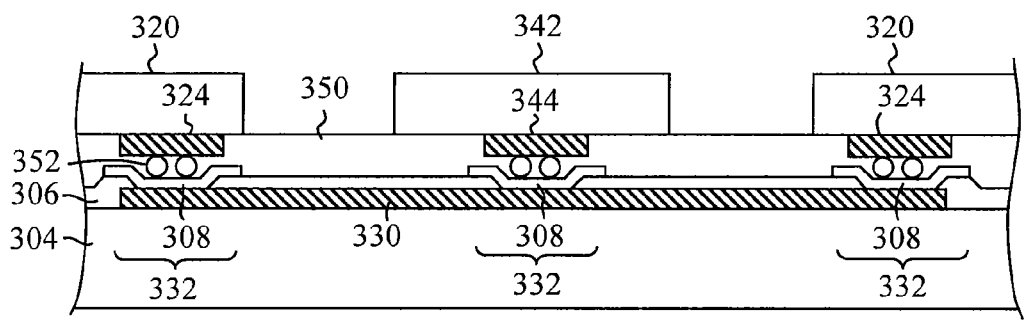
FIG. 1B is a cross-sectional view taken along section 1B in FIG. 1A.

FIG. 1B is a schematic view taken along section 1B-1B in FIG. 1A. The common wires 330 are patterned on a transparent substrate 304 of the LCD panel. A passivation layer 306 made of an insulating material is formed over the substrate 340 and includes openings exposing portions of the common wires 330. Contact layers 308 made of conductive materials are formed through the openings to connect with the common wires 330, thereby forming terminal pads of the common wires 330, also referred to as contact pads 332 herein.

An anisotropic conductive film 350 connects first connecting terminals 324 of the driver ICs 320 and second connecting terminals 344 provided in the extending portion 342 of the flexible printed circuit 340 to the common wires 330. Conductive particles 352 of the anisotropic conductive film 350 form conductive paths that electrically connect the first and second connecting terminals 324, 344 to the contact pads 332 of the common wires 330.

In one embodiment, the extending portion 342 of the flexible printed circuit 340 can be configured to overlap one or more common wires 330 for delivering power and ground voltages to the driver ICs 320. However, it is understood that the extending portion of the flexible printed circuit can overlap more common wires should more signal connections be needed between the flexible printed circuit and the driver ICs. As electrical signals are delivered from terminals in areas between the driver ICs, shorter signal paths are provided to prevent signal loss and the assembly space required for the flexible printed circuit can be favorably reduced.

Figure 2A:
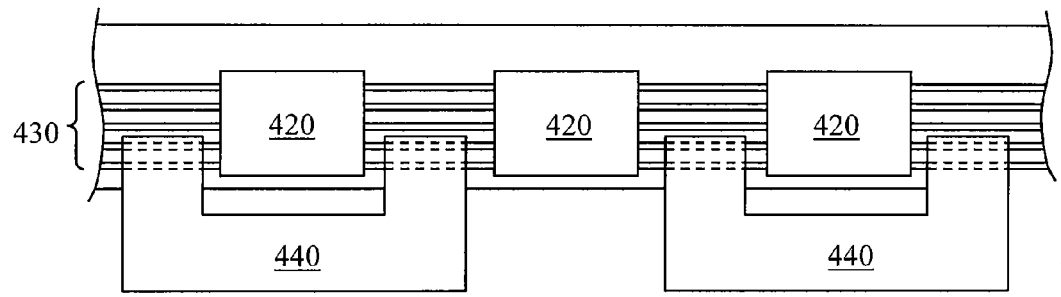
FIGS. 2A and 2B are schematic views of modules of flexible printed circuit according to various examples of the invention.
Figure 2B:
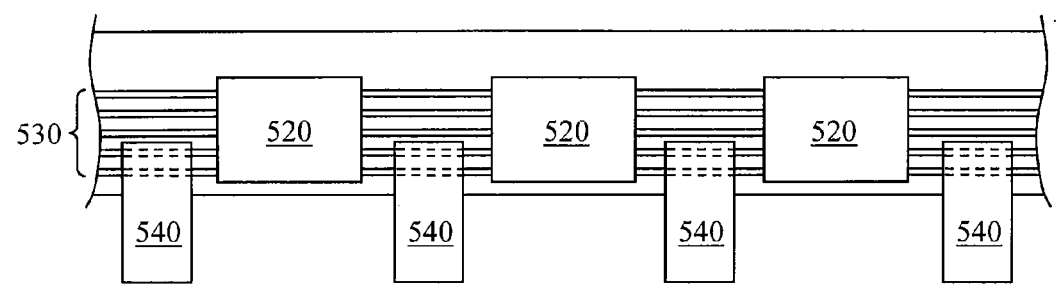

As illustrated in FIGS. 2A and 2B, the assembly of the flexible printed circuit in overlap with the common wires can favorably allow its modularization. As shown in FIG. 2A, U-shaped modules 440 of flexible printed circuit can be successively coupled with common wires 430 in areas between the driver ICs 420. In FIG. 2B, flexible printed circuits 540 of generally rectangular shapes can be coupled via the anisotropic conductive film with common wires 530 at spaced intervals along the common wires 530. The modularization of the flexible printed circuit into separate modules can favorably reduce its cost and optimize its occupation space in assembly.

FIGS. 3A~3D are schematic views of a process of mounting a flexible printed circuit and driver ICs on a LCD panel according to an embodiment of the invention. For purposes of illustration, in the present example, various steps are described in a particular order. However, when needed for specific configurations, these steps can be performed in orders different from the present embodiment.

Figure 3A:
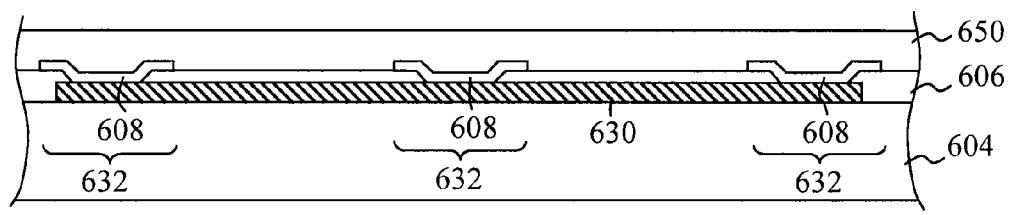
FIGS. 3A~3D are schematic views of an assembly process of driver components in the manufacture of a LCD panel according to an embodiment of the invention.

In FIG. 3A, an anisotropic conductive film 650 is laminated over a bonding area of the LCD panel. The bonding area can correspond to a peripheral non-display area on a substrate 604 of the LCD panel where a flexible printed circuit and driver ICs are to be mounted. The bonding area covered by the anisotropic conductive film 650 includes one or more common wire 630 that is patterned on the substrate 604 and is provided with terminal pads, also referred to as contact pads 632 herein. The contact pads 632 can be formed by contact layers 608 that connect with spaced-apart portions of the common wire 630 exposed through an insulating layer 606.

Figure 3B:
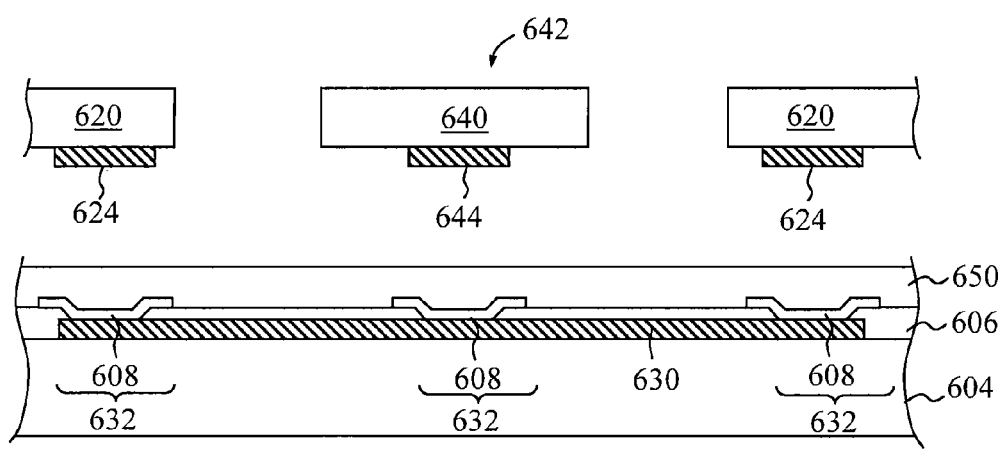
Figure 3C:
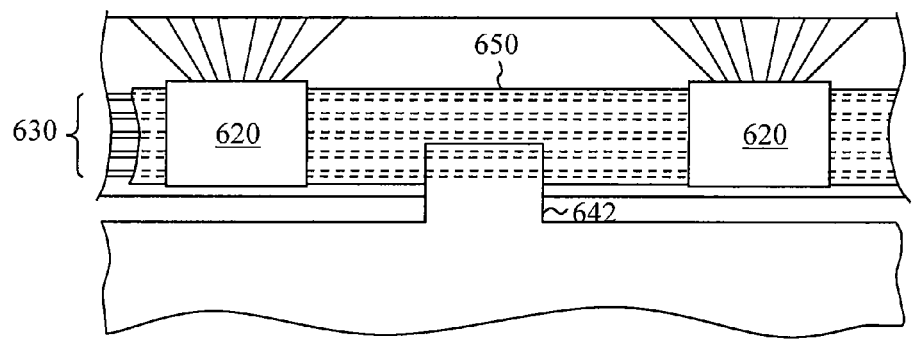

In FIG. 3B, two driver ICs 620 and a flexible printed circuit 640 are aligned over the substrate 604 so that their respective connecting terminals 624 and 644 approximately faces the contact pads 632 of the common wire 630. As shown in the planar view of FIG. 3C, the flexible printed circuit 640 is particularly placed so that an extending portion 642 overlaps with a portion of at least one common wire 630 in an area between the two driver ICs 620. The connecting terminals 644 of the flexible printed circuit 640 are located in an area of its extending portion 642.

Figure 3D:
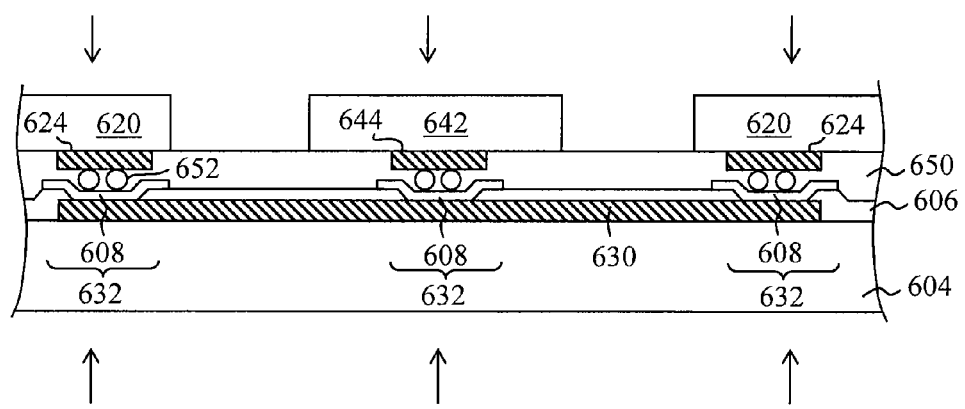

In FIG. 3D, the driver ICs 620 and extending portion 642 of the flexible printed circuit 640 are pressed against the substrate 604 while the anisotropic conductive film 650 is heated. The applied pressure can be approximately between 10 to 20 Kg/cm$^2$. If the anisotropic conductive film 650 is made of a thermosetting resin, the heating temperature can be about 180° C. to 190° C. If it is made of a thermoplastic material, the anisotropic conductive film 650 is heated and subsequently cooled to harden. The anisotropic conductive film 650 thereby attaches the driver ICs 620 and flexible printed circuit 640 on the substrate 604, and conductive particles 652 in the anisotropic conductive film 650 form conductive paths that electrically connect the connecting terminals 624, 644 of the driver ICs to the contact pads 632 of the common wire 630.

The above-described connection scheme can be particularly implemented to assemble driver ICs and flexible printed circuits via a single anisotropic conductive film along one side of the LCD panel. Since a single anisotropic conductive film is used, the driver ICs and the flexible printed circuits can be assembled in the same time. As a result, the material cost and the processing time can be favorably reduced.

Diverse variations of the invention as described above can be implemented. In a variant example, the anisotropic conductive film can include separate portions locally dispensed at the target areas instead of being formed of a continuous layer.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A flat display panel comprising:
   a substrate having at least one common wire;
   an insulating passivation layer formed over the substrate having a first opening, a second opening, and a third opening which expose portions of the at least one common wire, and wherein said third opening is between said first opening and said second opening;
   at least two driver integrated circuits spaced apart from each other and disposed in alignment and electrically connected with at least one common wire through said first opening and said second opening in the insulating passivation layer; and
   a flexible printed circuit including an extending portion that is located in an area between the at least two integrated driver circuits and aligned with a portion of at least one common wire located between the two integrated circuits, wherein the extending portion of the flexible printed circuit is electrically connected with the portion of at least one common wire located between the two driver integrated circuits via said third opening;
   wherein the extending portion of the flexible printed circuit overlaps at least one common wire permitting power and ground voltages to be delivered to the driver integrated circuits through the common wire.

2. The flat display panel according to claim 1, wherein the at least two integrated driver circuits and the portion of the flexible printed circuit are electrically connected with the common wire through an anisotropic conductive film.

3. The flat display panel according to claim 2, wherein the anisotropic conductive film is formed from a single continuous layer of an anisotropic conductive material.

4. The flat display panel according to claim 1, wherein any of the at least two integrated driver circuits includes a scan driver integrated circuit.

5. The flat display panel according to claim 1, wherein any of the at least two integrated driver circuits includes a data driver integrated circuit.

6. The flat display panel according to claim 1, wherein the at least two integrated driver circuits and the portion of the flexible printed circuit are aligned along a same side on a peripheral area of the substrate.

7. The flat display panel according to claim 1, wherein the flexible printed circuit includes a second portion electrically connected with at least one common wire at a position spaced apart from the at least two integrated circuits.

8. A flat display panel comprising:
   a substrate having a common wire in a peripheral area of the substrate, wherein the common wire includes a first, second and third contact pad spaced apart from one another, the third contact pad being located between the first and second contact pads;
   an insulating passivation layer formed over the substrate having a first opening, a second opening, and a third opening exposing portions of the common wires for electrical contact to the contact pads, and wherein said third opening is between said first opening and said second opening;
   a first integrated circuit having a first connection terminal aligned in position and electrically connected with the first contact pad via said first opening;
   a second integrated circuit having a second connection terminal aligned in position and electrically connected with the second contact pad via said second opening; and
   a flexible printed circuit having a portion provided with a third connection terminal aligned in position and electrically connected with the third contact pad via third opening;
   wherein an extending portion of the flexible printed circuit overlaps the common wire permitting power and ground voltages to be delivered to the integrated circuits through the common wire.

9. The flat display panel according to claim 8, wherein the first, second and third connection terminals are electrically connected with the first, second and third contact pads through an anisotropic conductive film.

10. The flat display panel according to claim 9, wherein the anisotropic conductive film is formed from a single continuous layer of an anisotropic conductive material.

11. The flat display panel according to claim 8, wherein any of the first or second integrated circuits includes a scan driver integrated circuit.

12. The flat display panel according to claim 8, wherein any of the first or second integrated circuits includes a data driver integrated circuit.

13. The flat display panel according to claim 8, wherein the first and second integrated circuits and the portion of the flexible printed circuit are aligned along a same side on a peripheral area of the substrate.

14. The flat display panel according to claim 8, wherein the portion of the flexible printed circuit is located in an area between the first and second integrated circuit.

15. The flat display panel according to claim 14, wherein the flexible printed circuit includes a second portion aligned in position and electrically connected with another portion of the common wire at a position spaced apart from the portion of the flexible printed circuit located in the area between the first and second integrated circuit.

16. A flat display panel comprising:
   a substrate;
   a common wire formed above and adjacent to said substrate;
   an insulating passivation layer formed above and adjacent to said substrate and said common wire, having a first opening and a second opening;
   a driver integrated circuit positioned above said insulating passivation layer and electrically connected with said common wire through said first opening; and
   a flexible printed circuit positioned above said insulating passivation layer and electrically connected with said common wire through said second opening;
   wherein said common wire provides power to said integrated circuit.

* * * * *